United States Patent
Bedeschi et al.

(10) Patent No.: US 7,068,534 B2
(45) Date of Patent: Jun. 27, 2006

(54) PHASE-CHANGE MEMORY DEVICE WITH OVERVOLTAGE PROTECTION AND METHOD FOR PROTECTING A PHASE-CHANGE MEMORY DEVICE AGAINST OVERVOLTAGES

(75) Inventors: Ferdinando Bedeschi, Monza (IT); Claudio Resta, Villa Di Tirano (IT); Guido Torelli, Sant'Alessio Con Vialone (IT)

(73) Assignees: STMicroelectronics S.r.l., Agrate Brianza (IT); Unisersita' Degli Studi Di Pavia, Pavia (IT)

( * ) Notice: Subject to any disclaimer, the term of this patent is extended or adjusted under 35 U.S.C. 154(b) by 0 days.

(21) Appl. No.: 10/987,933

(22) Filed: Nov. 12, 2004

(65) Prior Publication Data
US 2005/0180188 A1 Aug. 18, 2005

(30) Foreign Application Priority Data
Nov. 12, 2003 (EP) .................................. 03425728

(51) Int. Cl.
*G11C 11/00* (2006.01)
(52) U.S. Cl. ................. 365/163; 365/158; 365/189.09; 365/210
(58) Field of Classification Search ................ 365/163, 365/210, 158, 189.09
See application file for complete search history.

(56) References Cited

U.S. PATENT DOCUMENTS

| 6,456,524 B1 * | 9/2002 | Perner et al. ............... 365/158 |
| 6,608,773 B1 * | 8/2003 | Lowrey et al. ............. 365/100 |
| 6,707,712 B1 * | 3/2004 | Lowery ...................... 365/175 |

FOREIGN PATENT DOCUMENTS

| EP | 1 326 258 A2 | 7/2003 |
| EP | 1 339 066 A1 | 8/2003 |

* cited by examiner

*Primary Examiner*—Son T. Dinh
(74) *Attorney, Agent, or Firm*—Lisa K. Jorgenson; Timothy L. Boller; Seed IP Law Group PLLC (57) ABSTRACT

A phase change memory device includes a plurality of phase-change memory cells, arranged in rows and columns, phase-change memory cells arranged on the same column being connected to a same bit line; a plurality of first selectors, each coupled to a respective phase-change memory cell; an addressing circuit for selectively addressing at least one of the bit lines, one of the first selectors, and the phase-change memory cell connected to the addressed bit line and to the addressed first selector; and a regulated voltage supply circuit, selectively connectable to the addressed bit line, for supplying a bit line voltage. The bit line voltage is correlated to a first control voltage on the addressed first selector, coupled to the addressed phase-change memory cell.

35 Claims, 5 Drawing Sheets

PHASE-CHANGE MEMORY DEVICE WITH OVERVOLTAGE PROTECTION AND METHOD FOR PROTECTING A PHASE-CHANGE MEMORY DEVICE AGAINST OVERVOLTAGES

BACKGROUND OF THE INVENTION

1. Field of the Invention

The present invention relates to a phase-change memory device with overvoltage protection and to a method for protecting a phase-change memory device against over voltages.

2. Description of the Related Art

As is known, phase-change memory (PCM) elements exploit the characteristics of materials that have the property of changing between two phases having distinct electrical characteristics. For example, these materials may change from an amorphous phase, which is disorderly, to a crystalline or polycrystalline phase, which is orderly, and the two phases are associated to considerably different resistivity. Moreover, intermediate configurations, in which the material is only partially changed either to the amorphous or the crystalline phase, may be associated to intermediate resistivity values.

At present, alloys of group VI of the periodic table, such as Te or Se, referred to as chalcogenides or chalcogenic materials, can advantageously be used in phase-change cells. The chalcogenide that currently offers the most promise is formed by a Ge, Sb and Te alloy ($Ge_2Sb_2Te_5$), which is currently widely used for storing information in overwritable disks. In chalcogenides, the resistivity varies by two or more magnitude orders when the material passes from the amorphous phase (more resistive) to the polycrystalline phase (more conductive) and vice versa.

The use of PCM elements for forming memory cells and arrays has already been proposed. In particular, in phase-change memories, a thin film of chalcogenic material is employed as a programmable resistor, which can be electrically heated by a controlled current so as to be switched between a high and a low resistance condition, and vice versa. The state of the chalcogenic material may be read by applying a small voltage and measuring the current passing through it. Since the current is proportional to the conductance of the chalcogenic material, it is possible to discriminate between the two states.

Regarding PCM reading, one of the problems to deal with is to prevent too high voltages from being accidentally applied either to selected or to unselected PCM cells of a memory array, even during transients. High voltages, in fact, may cause undesired phase transitions of some PCM cells and loss of information stored therein and, in any case, reading errors. In order to prevent high voltages and noise caused by adjacent memory cells, a respective selector, such as a PNP bipolar transistor, a MOS transistor or a diode, is generally associated to each PCM cell. The selectors are connected in series with the respective PCM cells: accordingly, a same current flows through a selected PCM cell and the corresponding selector, when the latter is turned on, whereas only negligible leakage currents may flow otherwise.

Figure 1:
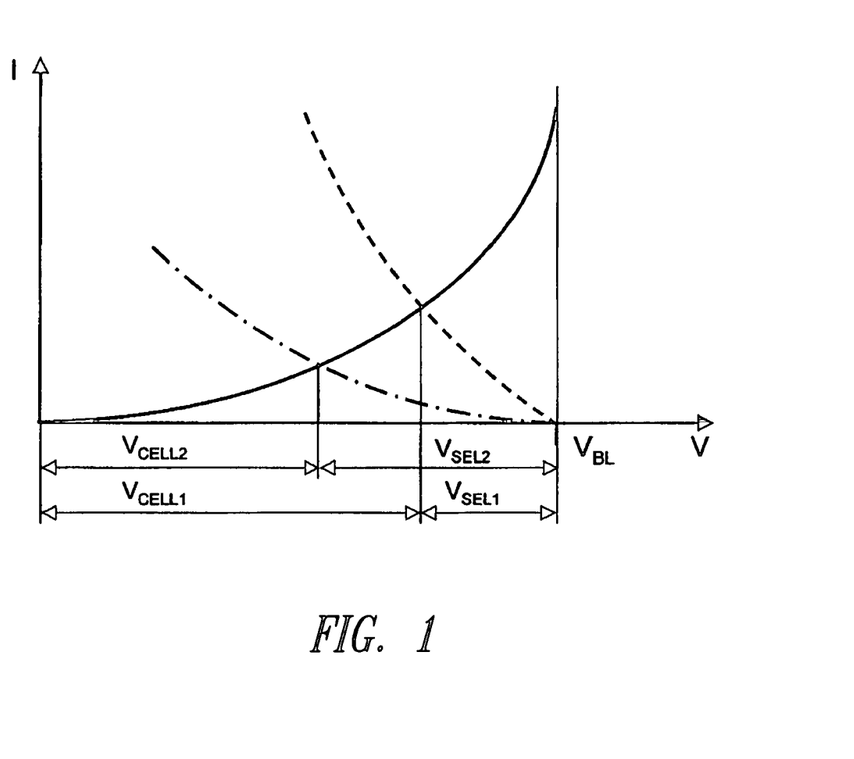
FIG. 1 is a graph showing quantities relating to a known phase-change memory device.

Anyway, the selectors may fail to protect the PCM cells. In fact, a selected PCM cell (or cells) is biased for reading through a respective bit line, which is maintained at a predetermined and constant bit line reading voltage. Since the selected PCM cell and the corresponding selector form a voltage divider which is fed with the bit line reading voltage, the voltage drop across the selected PCM cell is determined by the resistance ratio of the divider. However, both the resistance of the PCM cell and the conductivity of the selector in its on-state show unpredictable fluctuations, so that the voltage drop across the selected PCM cell may vary. For example, PCM cells may be programmed in an intermediate configuration with intermediate resistance, instead of being fully amorphous or fully crystalline. Furthermore, the conduction current-control voltage characteristics of the selectors depend on temperature; since these characteristics, especially for bipolar transistors and diodes, are non-linear, the resistance ratio of the divider is greatly affected, and the voltage drop across the selected PCM cell is consequently modified. FIG. 1 shows how the divider ratio may be influenced by the state of the PCM cell. In particular, the I–V characteristic of the selector is illustrated as a solid line, and the I–V characteristics of a PCM cell in a first and in a second state are shown as a dashed line and, respectively, as a dash-dot line (the first and the second state correspond to the same logic value, but the PCM cell resistivity is slightly higher in the second state than in the first state). In FIG. 1, $V_{BL}$ is the reading bit line voltage, $V_{CELL1}$, $V_{CELL2}$ are the voltage drops across the PCM cell in the first and, respectively, the second state, and $V_{SEL1}$, $V_{SEL2}$ are the control voltages of the selector in the two cases. In particular, the control voltage of the selector may fall to a very low value, so that the voltage drop across the selected PCM cell increases nearly up to the reading bit line voltage. Hence, in this case, the information stored in the PCM cell may be lost and reading errors may occur.

BRIEF SUMMARY OF THE INVENTION

In one aspect, a phase-change memory device comprises: a plurality of phase-change memory cells, arranged in rows and columns, said phase-change memory cells arranged on the same column being connected to a same bit line; a plurality of first selectors, each coupled to a respective said phase-change memory cell; an addressing system for selectively addressing at least one of said bit lines, one of said first selectors, and a phase-change memory cell connected to the addressed bit line and to the addressed first selector; and a voltage supply, for supplying a bit line voltage to said addressed bit line wherein said voltage supply comprises a voltage regulator for regulating said bit line voltage on the basis of a first control voltage on said addressed first selector, coupled to said addressed phase-change memory cell.

In another aspect, a method for reading a phase-change memory device comprises: providing a plurality of phase-change memory cells, arranged in rows and columns, said phase-change memory cells arranged on the same column being connected to a same bit line, and a plurality of first selectors, each coupled to a respective said phase-change memory cell; selectively addressing at least one of said bit lines, one of said first selectors, and the phase-change memory cell connected to the addressed bit line and to the addressed first selector; and supplying a bit line voltage to said addressed bit line wherein supplying said bit line voltage comprises regulating said bit line voltage on the basis of a first control voltage on said addressed first selector, coupled to said addressed phase-change memory cell.

In another aspect, a system comprises: a processor; a memory communicatively coupled to the processor, the memory comprising: a plurality of phase-change memory cells arranged in columns; a column decoder; and a biasing system comprising a plurality of reference selectors and configured to regulate a read voltage applied to a phase-change memory cell in the plurality of phase-change memory cells by controlling a current provided to a corresponding reference selector in the plurality of reference selectors.

In another aspect, a phase-change memory comprises: a first phase-change memory cell comprising a first terminal and a second terminal; a first array selector comprising a third terminal and a fourth terminal wherein the third terminal is electrically coupled to the first terminal of the first phase-change memory cell; a first addressing line electrically coupled to the second terminal of the first phase-change memory cell; a second addressing line electrically coupled to the fourth terminal of the first array selector; and a biasing system comprising a first reference selector having a fifth terminal electrically coupled to the second addressing line, wherein the biasing system is configured to control a voltage applied across the first and second terminals of the first phase-change memory cell during a read operation of the first phase-change memory cell.

In another aspect, a phase-change memory comprises: a plurality of phase-change memory cells; means for reading a phase-change memory cell in the plurality of phase-change memory cells; and means for controlling a voltage applied to a phase-change memory cell by the means for reading a phase-change memory cell.

In another aspect, a method of reading a phase-change memory cell in an array of phase-change memory cells comprises: selecting an array selector associated with the phase-change memory cell in the array of phase-change memory cells; sensing a current flowing through the array selector associated with the phase-change memory cell in the array of phase-change memory cells; controlling a voltage applied across the phase-change memory cell in the array of phase-change memory cells based on the sensed current.

BRIEF DESCRIPTION OF THE SEVERAL VIEWS OF THE DRAWING(S)

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn, are not intended to convey any information regarding the actual shape of the particular elements, and have been solely selected for ease of recognition in the drawings.

DETAILED DESCRIPTION OF THE INVENTION

Figure 2:
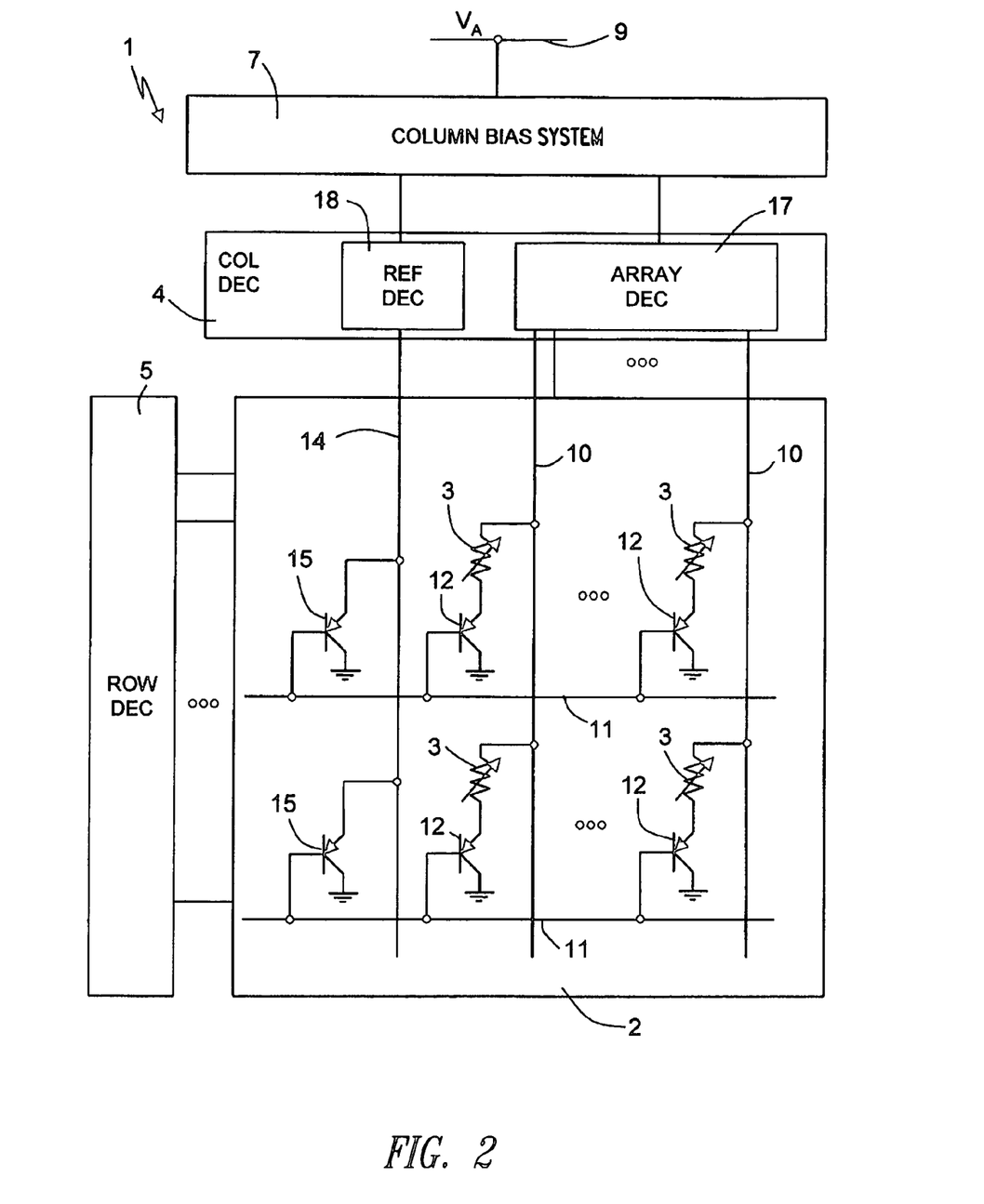
FIG. 2 is a simplified block diagram of an embodiment of a phase-change memory.

With reference to FIG. 2, a phase-change memory device 1 comprises an array 2 of PCM cells 3, arranged in rows and columns and schematically illustrated by symbols of variable resistors, a column decoder 4, a row decoder 5, a column bias system 7 and a supply line 9, providing a supply voltage $V_A$.

Figure 3:
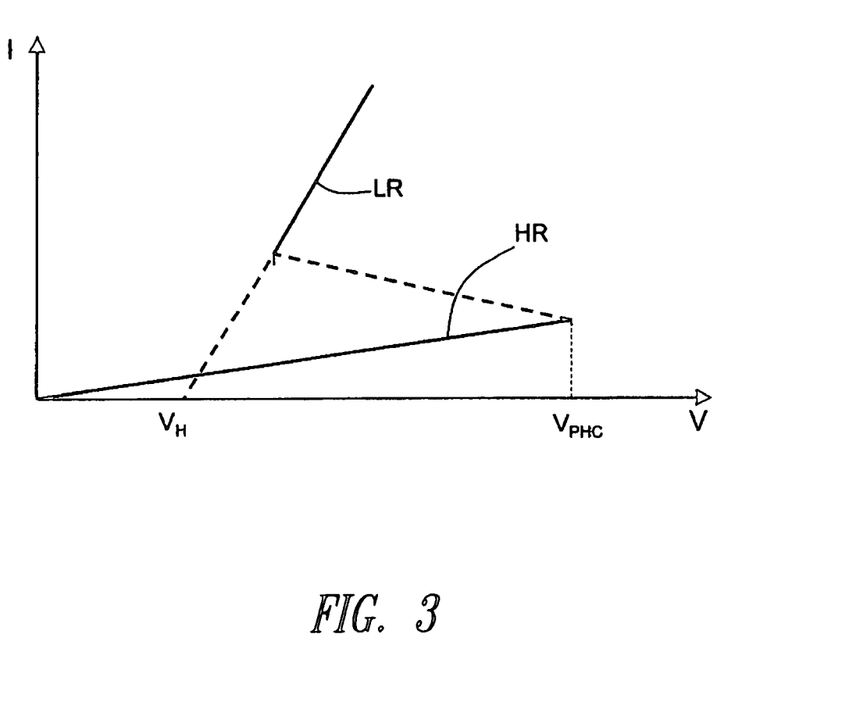
FIG. 3 graph showing quantities relating the phase-change memory of FIG. 2.

The PCM cells 3 of the array 2 have a current-voltage characteristic as illustrated in FIG. 3, where a low resistance state and a high resistance state are indicated with LR and HR, respectively. FIG. 3 further shows a phase-change voltage $V_{PHC}$, corresponding to transitions from the high resistance state HR to the low resistance state LR, and a hold voltage $V_H$, which is not to be overcome in order to prevent accidental phase transitions and reading errors. Turning again to FIG. 2, PCM cells 3 arranged on the same column have respective first terminals connected to a same common array bit line 10; PCM cells 3 arranged on a same row have respective second terminals coupled to a same word line 11 through respective array selectors 12, which as illustrated are PNP bipolar transistors. Each of the array selectors 12 has a collector terminal grounded and an emitter terminal connected to the second terminal of the respective PCM cell 3; moreover, array selectors 12 associated to PCM cells 3 arranged on a same row have respective base terminals connected to the same word line 11.

The array 2 comprises also a reference bit line 14 and a plurality of reference selectors 15 coupled to the reference bit line 14. The reference selectors 15 have collector terminals grounded, emitter terminals connected to the reference bit line 14 and base terminals connected to a respective word line 11. In one embodiment, the reference selectors 15 are identical to the array selectors 12. In practice, each word line 11 is coupled to a reference selector 15 and to an array selector 12 for each array bit line 10.

The column decoder 4 comprises an array column decoder 17 (hereinafter referred to as array decoder) and a reference decoder 18. In particular, the array decoder 17, which is for example a three-level PMOS decoder of a known type, is configured for connecting at least one addressed array bit line 10 to the column bias system 7. Similarly, the reference decoder 18 is configured for connecting the reference bit line 14 to the column bias system 7. In some embodiments the reference decoder 18 has the same structure as the array decoder 17.

Figure 4:
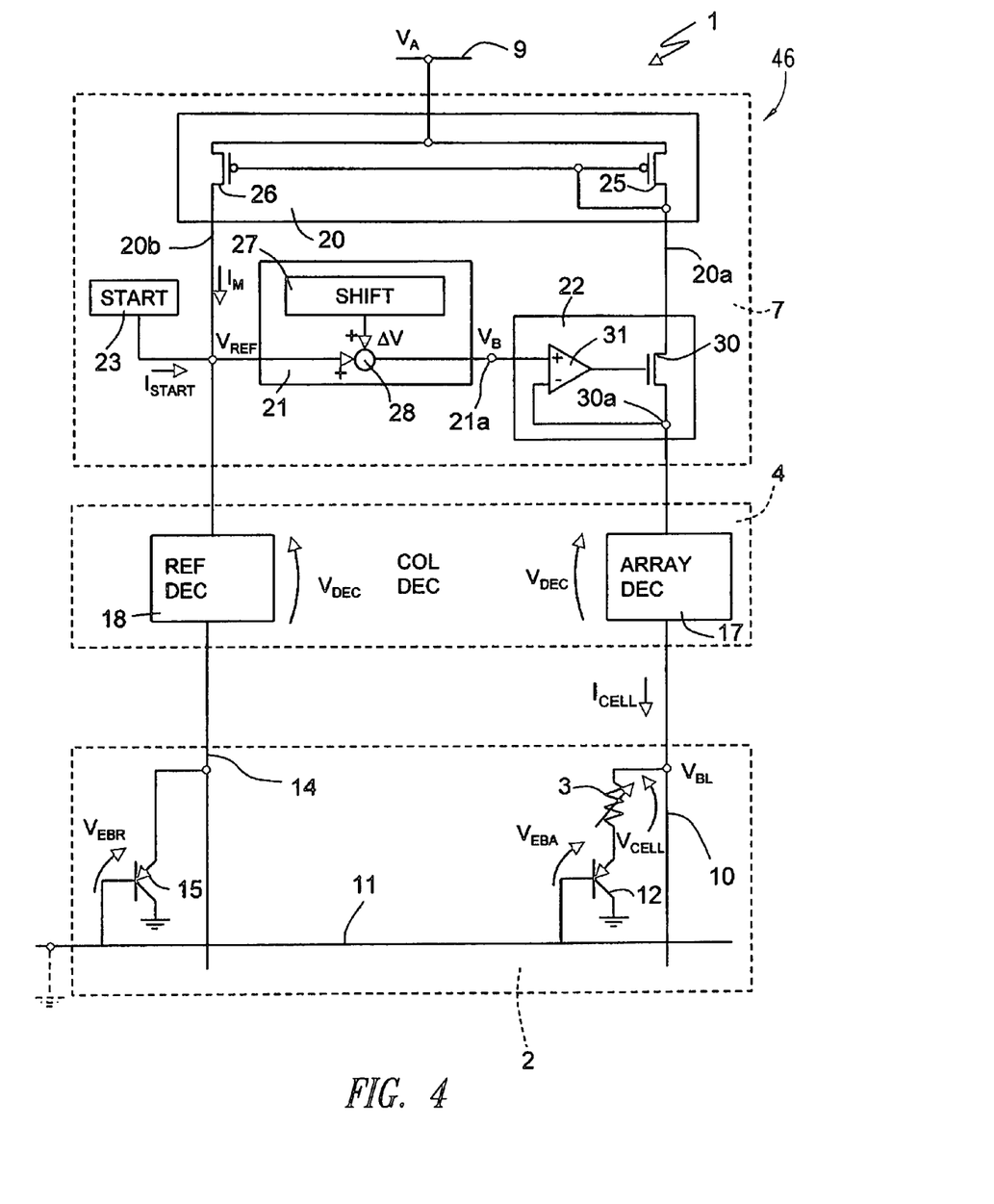
FIG. 4 is a more detailed block diagram of a part of the phase-change memory of FIG. 2.

With reference to FIG. 4, showing only an addressed PCM cell 3 of the array 2 and the corresponding array selector 12 and reference selector 15, the column bias system 7 comprises a current mirror 20, having a sensing terminal 20a and a mirror terminal 20b, a level shifter 21, an active cascode stage 22 and a start-up stage 23.

The current mirror 20 comprises a first and a second mirror transistor 25, 26, both of PMOS type. In one embodiment, the first and second mirror transistors 25, 26 are identical. The first mirror transistor 25 is connected in diode configuration, with its drain and gate terminals directly connected to each other, and has a source terminal connected to the supply line 9. Moreover, the drain terminal of the first mirror transistor 25 forms the sensing terminal 20a of the current mirror 20 and is connected to the addressed PCM cell 3 through the active cascode stage 22, the array decoder 17 and an addressed array bit line 10. The second mirror transistor 26 has its source and gate terminals respectively connected to the supply line 9 and to the gate terminal of the first mirror transistor 25. The drain terminal of the second mirror transistor 26 forms the mirror terminal 20b of the current mirror 20 and is connected to the reference selector 15 through the reference decoder 18 and the reference bit line 14.

The level shifter 21 has an input terminal connected to the mirror terminal 20b of the current mirror 20, for sensing a reference voltage $V_{REF}$, and an output terminal 21a connected to the active cascode stage 22 and supplying a bias voltage $V_B$. In the embodiment herein described, the level shifter 21 comprises a shift voltage generator 27, providing a shift voltage $\Delta V$, and an adder 28. The shift voltage generator 27 is preferably based on a band-gap voltage generator, so that the shift voltage $\Delta V$ is independent of temperature and of the currents flowing through the array bit lines 10 and the reference bit line 14. The adder 28 has a first input terminal, connected to the shift voltage generator 27; a second input terminal and an output terminal of the adder 28 respectively form the input terminal and the output terminal of the level shifter 21.

The active cascode stage 22 comprises a cascode transistor 30, of NMOS type, and an active amplifier 31. The cascode transistor 30 has a source terminal 30a, which is connected to the addressed PCM cell 3, through the array decoder 17 and the addressed bit line 10, and forms a regulated output terminal of the active cascode stage 22; a drain and a gate terminal of the cascode transistor 30 are connected to the sensing terminal 20a of the current mirror 20 and, respectively, to the output of the active amplifier 31. An inverting input and a non-inverting input of the active amplifier 31 are connected to the source terminal 30a of the cascode transistor 30 and, respectively, to the output terminal 21a of the level shifter 21.

The start-up stage 23 is connected to the mirror terminal 20b of the current mirror 20 and supplies a start-up current $I_{START}$, which is very low; for example, the start-up current $I_{START}$ is 50 nA.

During reading operation, the addressed word line 11 coupled to the addressed PCM cell is set to a predetermined word line reading voltage, so that a cell reading voltage $V_{CELL}$ is applied across the PCM cell 3, and an array control voltage $V_{EBA}$ drops across the emitter and the base terminal of the array selector 12 coupled thereto; in the embodiment herein described, the reading voltage is substantially the ground voltage (0 V; the ground connection for the addressed word line 11 is schematically illustrated as a dashed line in FIG. 4). Accordingly, a cell current $I_{CELL}$ starts flowing through the addressed PCM cell 3 and the corresponding array selector 12. The same cell current $I_{CELL}$ flows also through the addressed bit line 10, the array decoder 17, the cascode transistor 30 and the first mirror transistor 25. Hence, the current mirror 20 supplies a mirrored current $I_M$ through the reference decoder 18, the reference bit line 14 and the reference selector 15. The mirrored current $I_M$ is substantially equal to the cell current $I_{CELL}$. The start-up current $I_{START}$ is negligible as compared to the mirrored current $I_M$, and is used only to prevent the emitter of the reference selector 15 from remaining floating when the second mirror transistor 26 is off.

Owing to the reading voltage on the addressed word line 11, a reference control voltage $V_{EBR}$ arises between the emitter and the base terminals of the reference selector 15, which turns on. Since substantially equal currents flow through the array selector 12 and the reference selector 15, their control voltages (i.e., the array control voltage $V_{EBA}$ and the reference control voltage $V_{EBR}$) are substantially equal as well. Moreover, substantially equal decoding voltages $V_{DEC}$ drop across the array decoder 17 and the reference decoder 18, as far as they have similar operating characteristics, which can be achieved by providing a similar or identical structure. In view of the above, the reference voltage $V_{REF}$ on the mirror terminal 20b of the current mirror 20 is given by the equation:

$$V_{REF}=V_{EBR}+V_{DEC} \tag{1}$$

The level shifter 21 increases the reference voltage $V_{REF}$ up to the bias voltage $V_B$ by adding the shift voltage $\Delta V$. Hence, the bias voltage $V_B$ is given by:

$$V_B=V_{REF}+\Delta V=V_{EBR}+V_{DEC}+\Delta V \tag{2}$$

The active amplifier 31 drives the cascode transistor 30 so that the voltage on the source terminal of the cascode transistor 30 is substantially equal to the bias voltage $V_B$. Accordingly, the addressed array bit line 10 is biased at a bit line voltage $V_{BL}$ given by:

$$V_{BL}=V_B-V_{DEC}=V_{EBR}+\Delta V=V_{EBA}+\Delta V \tag{3}$$

It is also to be noted that, in addition to being both rather low, the decoding voltages $V_{DEC}$ associated to the array decoder 17 and to the reference decoder 18 balance each other and, therefore, could be anyway neglected. In practice, the reference selector 15 (with the reference bit line 14), the current mirror 20, the level shifter 21 and the cascode stage 22 form a bit line voltage regulator 46, which regulates the bit line voltage $V_{BL}$ on the basis of the array control voltage $V_{EBA}$. In particular, the first mirror transistor 25 senses the cell current $I_{CELL}$, that is correlated to the array control voltage $V_{EBA}$, and the second mirror transistor 26, the level shifter 21 and the cascode stage 22 regulate the bit line voltage $V_{BL}$ on the basis of the cell current $I_{CELL}$ and, hence, on the basis of the array control voltage $V_{EBA}$. The bit line voltage $V_{BL}$ comprises two terms: a first term (namely, the reference control voltage $V_{EBR}$) depends on the cell current $I_{CELL}$ through the mirror current $I_M$, and is always equal to the array control voltage $V_{EBA}$ of the array selector 12; a second term (namely, the shift voltage $\Delta V$) is constant and independent of temperature and of all the other voltages and currents in the phase change memory device 1, especially of the supply voltage $V_A$. The bit line voltage $V_{BL}$ is divided between the PCM cell 3 and the emitter-to-base junction of the array selector 12. Since the voltage associated to the emitter-to-base junction of the array selector 12 (i.e., the array control voltage $V_{EBA}$), is exactly equal to the reference control voltage $V_{EBR}$, it is clear that the cell reading voltage $V_{CELL}$ is equal to the shift voltage $\Delta V$; hence, the cell reading voltage $V_{CELL}$ is constant and independent of variations in the array control voltage $V_{EBA}$. In other words, the bit line voltage $V_{BL}$ that is provided to the addressed array bit line 10 is regulated so as to compensate for variations in the resistance ratio of the voltage divider formed by the PCM cell 3 and the emitter-to-base junction of the array selector 12. The bit line voltage $V_{BL}$ is reduced as soon as the array control voltage $V_{EBA}$ decreases. Accordingly, the cell reading voltage $V_{CELL}$ is maintained constant, and overvoltages are prevented, as well as reading errors or loss of information stored in the PCM cells 3. Regulation of the bit line voltage $V_{BL}$ is based on sensing the cell current $I_{CELL}$, which is correlated to the array control voltage $V_{EBA}$.

Figure 5:
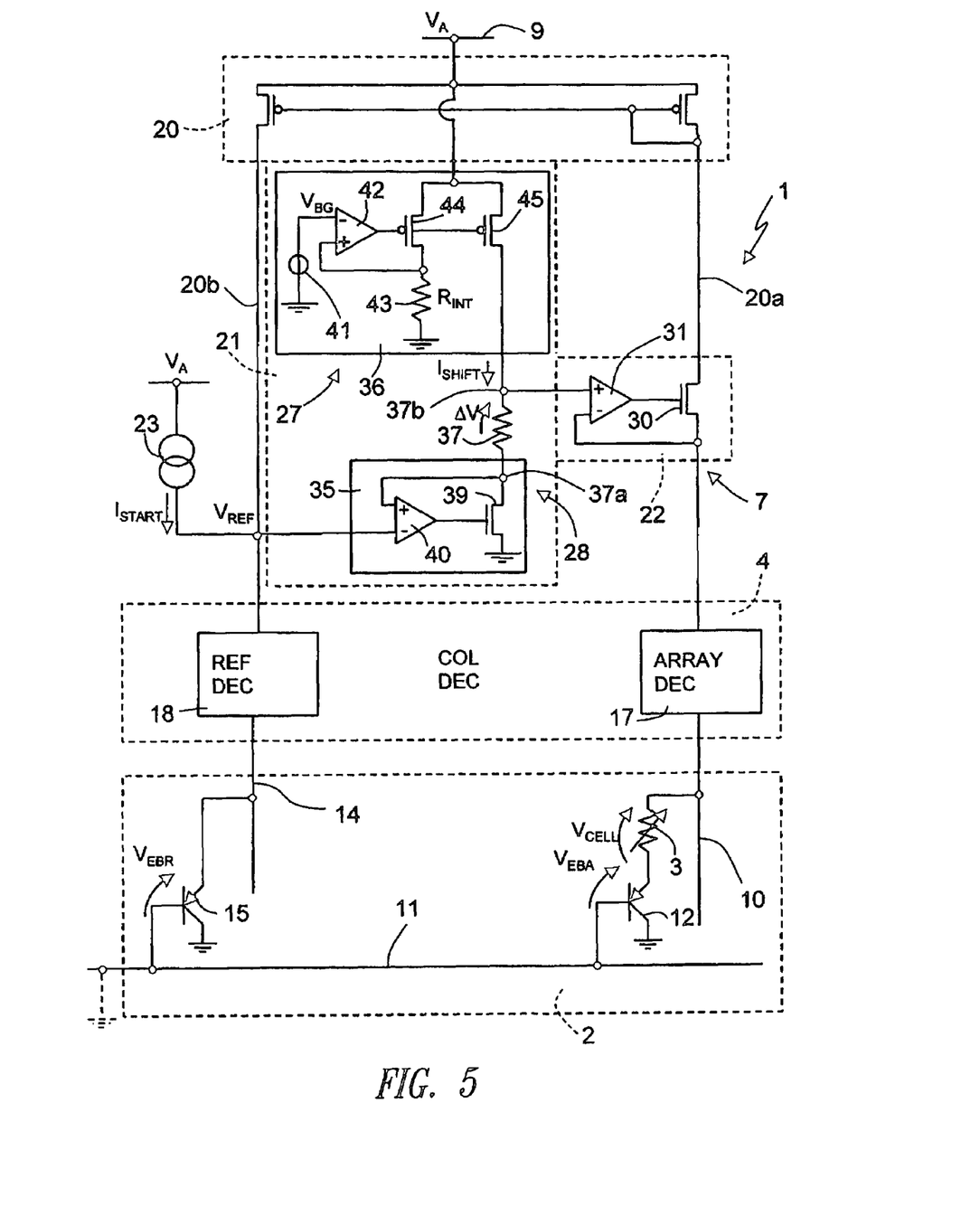
FIG. 5 is a more detailed electric diagram of the phase-change memory of FIG. 2.

FIG. 5 shows a more detailed electrical diagram of a column bias system 7, especially of the level shifter 21. The level shifter 21 comprises a buffer stage 35, a shift current generator 36, supplying a shift current $I_{SHIFT}$, and a shift resistor 37, which, in practice, is shared between the shift voltage generator 27 and the adder 28. More precisely, the shift voltage generator 27 is based on the shift current generator 36 and uses the shift resistor 37 for converting the shift current $I_{SHIFT}$ into the shift voltage ΔV; and the adder 28 comprises the buffer stage 35 as an input unit, and uses the shift resistor 37 for adding the shift voltage ΔV to the reference voltage $V_{REF}$ on the mirror terminal 20b of the current mirror 20.

In detail, the buffer stage 35 comprises a buffer transistor 39 and a buffer amplifier 40. The buffer transistor 39, of NMOS type, has a source terminal grounded, a drain terminal connected to a first terminal 37a of the shift resistor 37 and a gate terminal connected to an output terminal of the buffer amplifier 40. Moreover, the buffer amplifier 40 has an inverting input, connected to the mirror terminal 20b of the current mirror 20, and a non-inverting input, connected to the drain terminal of the buffer transistor 39 and to the first terminal 37a of the shift resistor 37.

The shift current generator 36 comprises a band-gap voltage generator 41, providing a band-gap voltage $V_{BG}$ which is independent of temperature and of the supply voltage $V_A$, an amplifier 42, an internal resistor 43, having an internal resistance $R_{INT}$, and two PMOS transistors 44, 45. Furthermore, an output terminal of the shift current generator 36 is connected to a second terminal 37b of the shift resistor 37, which forms the output terminal of the level shifter 21 as well. The band-gap voltage generator 41, the amplifier 42, the internal resistor 43, and the PMOS transistor 44 form a feedback loop which maintains a voltage drop across the resistor 43 equal to the band-gap voltage $V_{BG}$. Thus, a current equal to $V_{BG}/R_{INT}$ flows through the internal resistor 42 and the PMOS transistor 44 and the shift current $I_{SHIFT}$, which is the current flowing through the PMOS transistor 45, is given by the following equation:

$$I_{SHIFT} = K \frac{V_{BG}}{R_{INT}} \quad (4)$$

where K is a constant coefficient correlated to the aspect ratio of the PMOS transistors 44, 45 (namely, the ratio thereof).

In operation, the buffer amplifier 40 drives the buffer transistor 39 so that the drain terminal thereof is maintained at the reference voltage $V_{REF}$ and, at the same time, the shift current $I_{SHIFT}$ flows through the buffer transistor 39 and through the shift resistor 37. In practice, the shift current $I_{SHIFT}$ is converted into the shift voltage ΔV, which drops across the shift resistor 37. Hence, the shift voltage ΔV is constant and substantially independent of temperature and of supply voltage $V_A$, as it is given by:

$$\Delta V = R_S I_{SHIFT} = K V_{BG} \frac{R_S}{R_{INT}} \quad (5)$$

where $R_S$ is a resistance of the shift resistor 37. Moreover, the voltage on the second terminal 37b of the shift resistor 37 (i.e., the bias voltage $V_B$) is always greater than the voltage on the drain terminal of the buffer transistor 39 (i.e., the reference voltage $V_{REF}$) by exactly the shift voltage ΔV, which drops across the shift resistor 37. In other words, the reference voltage $V_{REF}$ and the shift voltage ΔV are added to form the bias voltage $V_B$.

Since the shift voltage ΔV is equal to the cell voltage $V_{CELL}$ applied to the addressed PCM cell 3, the resistance $R_S$ of the shift resistor 37 is sized according to equation (5) so that the shift voltage ΔV is lower than the hold voltage $V_H$ (see FIG. 3). Applying too high voltages to the addressed PCM 3 cell is thus prevented.

Figure 6:
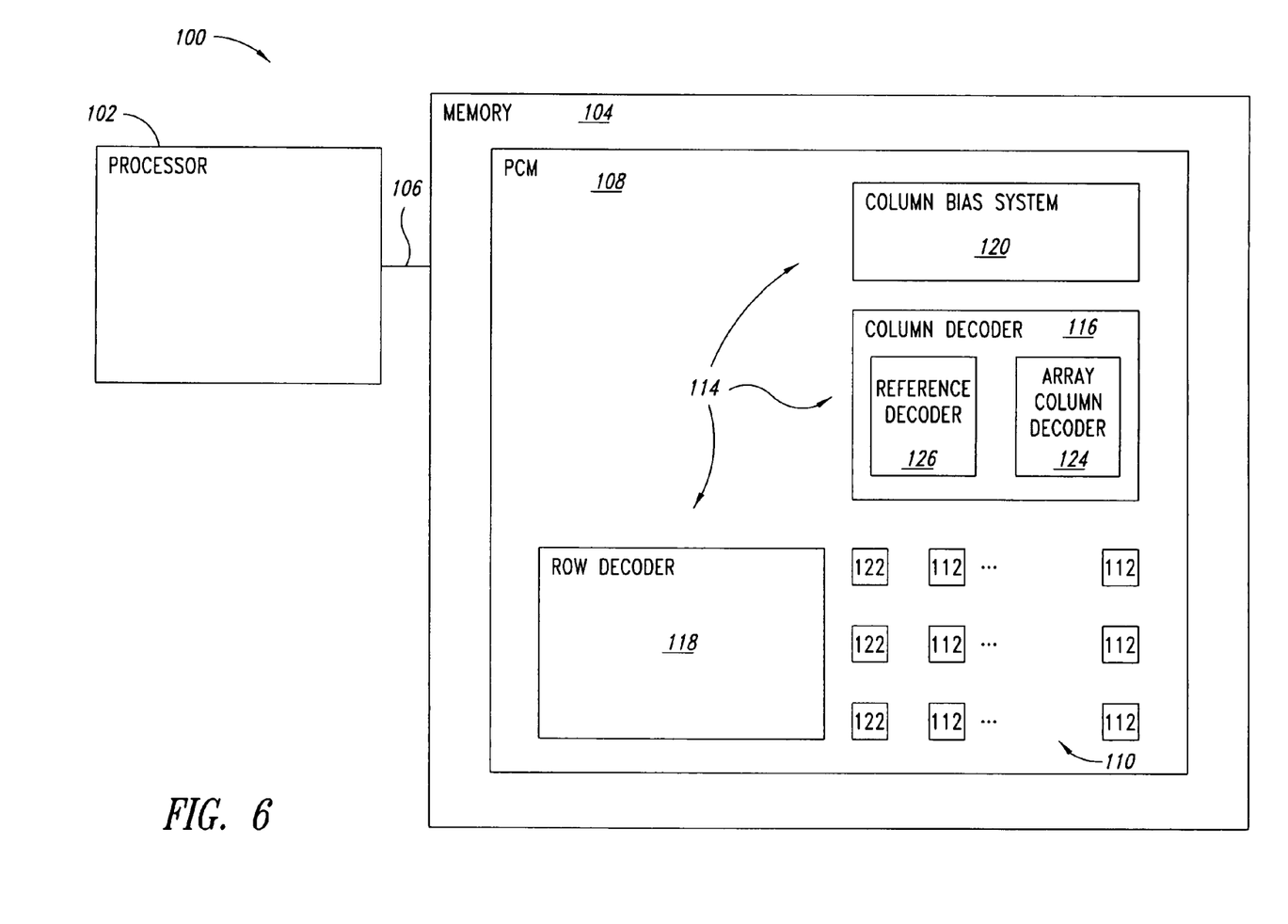
FIG. 6 is a functional block diagram of a system employing an embodiment of a phase-change memory.

FIG. 6 is a functional block diagram of a system 100 employing a phase-change memory in accordance with the present disclosure. The system 100 comprises a processor 102 coupled to a memory 104 by a system bus 106. The system bus 106 may include a power bus, control bus, and status signal bus in addition to a data bus. For the sake of clarity, however, the various control system buses are illustrated in FIG. 6 as the system bus 106.

The memory 104 comprises a PCM 108 comprising an array 110 of PCM cells 112, and an addressing system 114 comprising a column decoder 116, a row decoder 118, and a column bias system 120. The array 110 also comprises a plurality of reference selectors 122. The column decoder 116 comprises an array column decoder 124 and a reference decoder 126.

The advantages of the invention are clear form the above description. First, the PCM cells are protected against overvoltages during reading, because the voltage applied thereto is maintained at a constant safe value. Accordingly, reading errors and loss of information that may be caused by high bias voltages are avoided. Moreover, the regulation of the bit line voltage is very accurate and fast, so that both slow temperature fluctuations and rapid disturbances, such as noise superimposition, are efficiently compensated. Hence, the reliability of the phase change memory device is significantly improved.

Finally, it is clear that numerous modifications and variations may be made to the phase change memory device described and illustrated herein, all falling within the scope of the invention, as defined in the attached claims. First, the phase change memory device may comprise a plurality of reference bit lines, each coupled to a respective column of reference selectors. The number of reference bit lines may be set equal to the number of array bit lines that may be simultaneously addressed for reading. In alternative, a single reference selector may be provided for each reference bit line; in this case, the reference selector is always maintained in its on state and the reference decoder is replaced by a dummy circuit (for example, one dummy transistor for each decoding level of the array decoder). Moreover, the array and reference selectors might be formed by NPN bipolar transistors, MOS transistors or diodes as well.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A phase-change memory device comprising:
   a plurality of phase-change memory cells, arranged in rows and columns, said phase-change memory cells arranged on the same column being connected to a same bit line;
   a plurality of first selectors, each coupled to a respective said phase-change memory cell;
   an addressing system for selectively addressing at least one of said bit lines, one of said first selectors, and a phase-change memory cell connected to the addressed bit line and to the addressed first selector; and a voltage supply, for supplying a bit line voltage to said addressed bit line wherein said voltage supply comprises a voltage regulator for regulating said bit line voltage on the basis of a first control voltage on said addressed first selector, coupled to said addressed phase-change memory cell.

2. A memory device according to claim 1 wherein said voltage regulator comprises a current sensing element, for sensing a first current flowing through said addressed first selector and said addressed phase-change memory cell when said first control voltage is supplied to said addressed first selector, and a regulating stage, coupled to said current sensing element and to said addressed bit line for regulating said bit line voltage on the basis of said first current.

3. A memory device according to claim 2 wherein said regulating stage comprises at least one second selector, identical to said first selectors.

4. A memory device according to claim 3 wherein said regulating stage comprises a first current supplying element, controlled by said current sensing element for supplying a second current to said second selector.

5. A memory device according to claim 4 wherein said current sensing element and said first current supplying element respectively comprise a first transistor and a second transistor, arranged in current mirror configuration.

6. A memory device according to claim 4 wherein said second current is substantially equal to said first current.

7. A memory device according to claim 3 wherein said regulating stage comprises a level shifter, having an input terminal connected to said second selector for sensing a reference voltage correlated to a second control voltage on said second selector, and an output terminal for providing a bias voltage greater than said second control voltage by at least a constant shift voltage.

8. A memory device according to claim 7 wherein said level shifter comprises a shift voltage generator, providing said constant shift voltage, and an adder having a first input terminal, connected to said shift voltage generator, a second input terminal, connected to said second selector for sensing said reference voltage, and an output terminal, supplying said bias voltage.

9. A memory device according to claim 7 wherein said level shifter comprises a shift resistor, a buffer input unit, coupled between said second selector and a first terminal of said shift resistor, and a shift current generator, connected to a second terminal of said shift resistor for supplying a shift current to said shift resistor.

10. A memory device according to claim 7 wherein said regulating stage comprises an active stage, having an input terminal, connected to said output terminal of said level shifter, for receiving said bias voltage, and a regulated output terminal, connected to said addressed bit line.

11. A memory device according to claim 3 wherein said regulating stage comprises a second current supplying element for supplying a predetermined constant third current to said second selector.

12. A method for reading a phase-change memory device, comprising:

providing a plurality of phase-change memory cells, arranged in rows and columns, said phase-change memory cells arranged on the same column being connected to a same bit line, and a plurality of first selectors, each coupled to a respective said phase-change memory cell;

selectively addressing at least one of said bit lines, one of said first selectors, and the phase-change memory cell connected to the addressed bit line and to the addressed first selector; and supplying a bit line voltage to said addressed bit line wherein supplying said bit line voltage comprises regulating said bit line voltage on the basis of a first control voltage on said addressed first selector, coupled to said addressed phase-change memory cell.

13. A method according to claim 12 wherein supplying a bit line voltage further comprises sensing a first current flowing through said addressed first selector and said addressed phase-change memory cell when said first control voltage is supplied to said addressed first selector, and regulating said bit line voltage on the basis of said first current.

14. A method according to claim 13 wherein regulating said bit line voltage comprises supplying a second current to a second selector, identical to said first selectors, said second current being substantially equal to said first current.

15. A method according to claim 14 wherein regulating said bit line voltage comprises sensing a reference voltage correlated to a second control voltage on said second selector, and providing a bias voltage greater than said second control voltage by at least a constant shift voltage.

16. A method according to claim 15 wherein providing a bias voltage comprises generating said constant shift voltage and adding said reference voltage and said constant shift voltage.

17. A system comprising:
a processor;
a memory communicatively coupled to the processor, the memory comprising:
a plurality of phase-change memory cells arranged in columns;
a column decoder; and
a biasing system including a plurality of reference selectors and configured to regulate a read voltage applied to a phase-change memory cell in the plurality of phase-change memory cells by controlling a current provided to a corresponding reference selector in the plurality of reference selectors.

18. The system of claim 17 wherein the plurality of phase-change memory cells each comprises an array selector.

19. The system of claim 17 wherein each array selector is identical to a corresponding reference selector.

20. A phase-change memory, comprising:
a first phase-change memory cell including a first terminal and a second terminal;
a first array selector including a third terminal and a fourth terminal wherein the third terminal is electrically coupled to the first terminal of the first phase-change memory cell;
a first addressing line electrically coupled to the second terminal of the first phase-change memory cell;
a second addressing line electrically coupled to the fourth terminal of the first array selector; and
a biasing system including a first reference selector having a fifth terminal electrically coupled to the second addressing line, wherein the biasing system is configured to control a voltage applied across the first and second terminals of the first phase-change memory cell during a read operation of the first phase-change memory cell.

21. The phase-change memory of claim 20 wherein the first array selector is identical to the first reference selector.

22. The phase-change memory of claim 20, further comprising:
- a second phase-change memory cell including a sixth terminal and a seventh terminal; and
- a second array selector including an eighth terminal and a ninth terminal wherein the eighth terminal is electrically coupled to the sixth terminal of the second phase-change memory cell and the biasing system is configured to control a voltage applied across the sixth and seventh terminals of the second phase-change memory cell during a read operation of the second phase-charge memory cell.

23. The phase-change memory of claim 22, further comprising:
- a third addressing line electrically coupled to the seventh terminal of the second phase-change memory cell; and
- a fourth addressing line electrically coupled to the ninth terminal of the second array selector,
- wherein the biasing system further includes a second reference selector having a tenth terminal electrically coupled to the fourth addressing line.

24. The memory of claim 23 wherein the second reference selector is identical to the second array selector.

25. The memory of claim 20 wherein the biasing system further includes a current mirror electrically coupleable to the first reference selector and the first address line.

26. The memory of claim 25 wherein the biasing system further includes a level shifter and an amplifier electrically coupled to the current mirror.

27. A phase-change memory comprising:
- a plurality of phase-change memory cells;
- means for reading a phase-change memory cell in the plurality of phase-change memory cells comprising an array selector; and
- means for controlling a voltage applied to a phase-change memory cell by the means for reading a phase-change memory cell comprising a corresponding reference selector.

28. The phase-change memory of claim 27 wherein the array selector is identical to the reference selector.

29. A method of reading a phase-change memory cell in an array of phase-change memory cells, comprising:
- selecting an array selector associated with the phase-change memory cell in the array of phase-change memory cells;
- sensing a current flowing through the array selector associated with the phase-change memory cell in the array of phase-change memory cells;
- controlling a voltage applied across the phase-change memory cell in the array of phase-change memory cells based on the sensed current, wherein controlling the voltage across the phase-change memory cell in the array of phase-change memory cells based on the sensed current comprises mirroring the sensed current.

30. The method of claim 29 wherein controlling a voltage across the phase-change memory cell in the array of phase-change memory cells based on the sensed current further comprises shifting a voltage between an input and an output of the current mirror.

31. A phase-change memory, comprising:
- a plurality of phase-change memory cells, arranged in rows and columns, said phase-change memory cells arranged on the same column being connected to a same bit line, and a plurality of first selectors, each coupled to a respective said phase-change memory cell;
- means for selectively addressing at least one of said bit lines, one of said first selectors, and the phase-change memory cell connected to the addressed bit line and to the addressed first selector; and
- means for supplying a bit line voltage to said addressed bit line configured to regulate said bit line voltage on the basis of a first control voltage on said addressed first selector, coupled to said addressed phase-change memory cell.

32. The phase-change memory of claim 31 wherein the means for supplying a bit line voltage is configured to sense a first current flowing through said addressed first selector and said addressed phase-change memory cell when said first control voltage is supplied to said addressed first selector, and to regulate said bit line voltage on the basis of said first current.

33. The phase-change memory of claim 32 wherein the means for supplying a bit line voltage is configured to supply a second current to a second selector, identical to said first selectors, said second current being substantially equal to said first current.

34. The phase-change memory of claim 33 wherein the means for supplying a bit line voltage is configured to sense a reference voltage correlated to a second control voltage on said second selector, and provide a bias voltage greater than said second control voltage by at least a constant shift voltage.

35. The phase-change memory of claim 34 wherein the means for supplying a bit line voltage is configured to generate said constant shift voltage and add said reference voltage and said constant shift voltage.

* * * * *

UNITED STATES PATENT AND TRADEMARK OFFICE
CERTIFICATE OF CORRECTION

PATENT NO. : 7,068,534 B2
APPLICATION NO. : 10/987933
DATED : June 27, 2006
INVENTOR(S) : Ferdinando Bedeschi et al.

It is certified that error appears in the above-identified patent and that said Letters Patent is hereby corrected as shown below:

Title Page
Item (73) Assignees:
"Unisersita' Degli Studi Di Pavia" should read as --Universita' Delgli Studi De Pavia--

Signed and Sealed this

Nineteenth Day of December, 2006

JON W. DUDAS
*Director of the United States Patent and Trademark Office*